(12) United States Patent
Dunn

(10) Patent No.: US 7,248,845 B2
(45) Date of Patent: Jul. 24, 2007

(54) VARIABLE-LOSS TRANSMITTER AND METHOD OF OPERATION

(75) Inventor: Doug Dunn, Chula Vista, CA (US)

(73) Assignee: Kyocera Wireless Corp., San Diego, CA (US)

( * ) Notice: Subject to any disclaimer, the term of this patent is extended or adjusted under 35 U.S.C. 154(b) by 455 days.

(21) Appl. No.: 10/887,772

(22) Filed: Jul. 9, 2004

(65) Prior Publication Data

US 2006/0009174 A1    Jan. 12, 2006

(51) Int. Cl.
*H04B 1/04*    (2006.01)
*H03G 3/20*    (2006.01)

(52) U.S. Cl. .............................. 455/127.1; 455/127.2; 455/114.3; 330/129

(58) Field of Classification Search ................ 455/126, 455/127.1–127.5, 114.1–114.3, 120, 123, 455/125; 330/127, 129, 133, 167, 285, 303
See application file for complete search history.

(56) References Cited

U.S. PATENT DOCUMENTS

| | | | |
|---|---|---|---|
| 3,239,838 A | 3/1966 | Kelleher | |
| 3,413,543 A | 11/1968 | Schubring et al. | |
| 3,569,795 A | 3/1971 | Gikow | |
| 3,676,803 A | 7/1972 | Simmons | |
| 3,678,305 A | 7/1972 | George | |
| 3,680,135 A | 7/1972 | Boyer | |
| 3,737,814 A | 6/1973 | Pond | |
| 3,739,299 A | 6/1973 | Adler | |
| 3,836,874 A | 9/1974 | Maeda et al. | |
| 3,918,012 A | 11/1975 | Peuzin | |
| 4,122,400 A | 10/1978 | Medendorp et al. | |
| 4,236,125 A | 11/1980 | Bernard et al. | |
| 4,475,108 A | 10/1984 | Moser | |
| 4,484,157 A | 11/1984 | Helle et al. | |
| 4,494,081 A | 1/1985 | Lea et al. | |
| 4,525,720 A | 6/1985 | Corzine et al. | |
| 4,626,800 A | 12/1986 | Murakami et al. | |

(Continued)

FOREIGN PATENT DOCUMENTS

DE    40 36 866    7/1991

(Continued)

OTHER PUBLICATIONS

Chandler, S.R. et al., "Active Varactor Tunable Bandpass Filter," IEEE Microwave and Guided Wave Letters, vol. 3, No. 3, Mar. 1993, pp. 70-71.
Chang, C. et al., "Microwave Active Filters Based on Coupled Negative Resistance Method," IEEE Trans. on Microwave Theory & Techs., vol. 38, No. 12, Dec. 1990, pp. 1879-1884.
Cohn, S.B., "Dissipation Loss in Multiple-Coupled-Resonator Filters," Proc. IRE 47, Aug. 1959, pp. 1342-1348.

(Continued)

*Primary Examiner*—Duc M. Nguyen

(57) ABSTRACT

An exemplary transceiver comprises a power amplifier configured to receive a source signal and generate an amplified output signal, an antenna coupled to the power amplifier, the antenna being configured to radiate the amplified output signal, and a controller coupled to the power amplifier. The controller is configured to control an effective gain of the power amplifier based on a power level of operation of the transmitter. A source amplifier configured to operate on the source signal prior to power amplification is also controlled by the controller. The controller configures the gain level of the source amplifier based on the power level of operation of the transmitter and the effective gain of the power amplifier to improve signal-to-noise ratio.

20 Claims, 2 Drawing Sheets

U.S. PATENT DOCUMENTS

| | | | |
|---|---|---|---|
| 4,733,328 A | 3/1988 | Blazej | |
| 4,736,169 A | 4/1988 | Weaver et al. | |
| 4,737,797 A | 4/1988 | Siwiak et al. | |
| 4,746,925 A | 5/1988 | Toriyama | |
| 4,792,939 A | 12/1988 | Hikita et al. | |
| 4,799,066 A | 1/1989 | Deacon | |
| 4,835,499 A | 5/1989 | Pickett | |
| 4,835,540 A | 5/1989 | Haruyama et al. | |
| 4,847,626 A | 7/1989 | Kahler et al. | |
| 4,908,853 A | 3/1990 | Matsumoto | |
| 4,975,604 A | 12/1990 | Barta | |
| 5,166,857 A | 11/1992 | Avanic et al. | |
| 5,173,709 A | 12/1992 | Lauro et al. | |
| 5,212,463 A | 5/1993 | Babbitt et al. | |
| 5,216,392 A | 6/1993 | Fraser | |
| 5,227,748 A | 7/1993 | Sroka | |
| 5,231,407 A | 7/1993 | McGirr et al. | |
| 5,293,408 A | 3/1994 | Takahashi et al. | |
| 5,307,033 A | 4/1994 | Koscica et al. | |
| 5,325,099 A | 6/1994 | Nemit et al. | |
| 5,361,403 A * | 11/1994 | Dent | 455/74 |
| 5,388,021 A | 2/1995 | Stahl | |
| 5,406,163 A | 4/1995 | Carson et al. | |
| 5,416,803 A | 5/1995 | Janer | |
| 5,427,988 A | 6/1995 | Sengupta et al. | |
| 5,450,092 A | 9/1995 | Das | |
| 5,451,915 A | 9/1995 | Katzin et al. | |
| 5,459,123 A | 10/1995 | Das | |
| 5,472,935 A | 12/1995 | Yandrofski et al. | |
| 5,479,139 A | 12/1995 | Koscica et al. | |
| 5,495,215 A | 2/1996 | Newell et al. | |
| 5,496,795 A | 3/1996 | Das | |
| 5,496,796 A | 3/1996 | Das | |
| 5,502,422 A | 3/1996 | Newell et al. | |
| 5,525,942 A | 6/1996 | Horii et al. | |
| 5,557,286 A | 9/1996 | Varadan et al. | |
| 5,561,307 A | 10/1996 | Mihara et al. | |
| 5,561,407 A | 10/1996 | Koscica et al. | |
| 5,564,086 A | 10/1996 | Cygan et al. | |
| 5,574,410 A | 11/1996 | Collins et al. | |
| 5,577,025 A | 11/1996 | Skinner | |
| 5,583,524 A | 12/1996 | Milroy | |
| 5,589,845 A | 12/1996 | Yandrofski | |
| 5,600,279 A | 2/1997 | Mori | |
| 5,617,104 A | 4/1997 | Das | |
| 5,640,042 A | 6/1997 | Koscica et al. | |
| 5,649,306 A | 7/1997 | Vanatta et al. | |
| 5,652,599 A | 7/1997 | Wallace et al. | |
| 5,673,188 A | 9/1997 | Lusher et al. | |
| 5,701,595 A | 12/1997 | Green, Jr. | |
| 5,721,194 A | 2/1998 | Yandrofski et al. | |
| 5,729,239 A | 3/1998 | Rao | |
| 5,777,524 A | 7/1998 | Wojewoda et al. | |
| 5,777,839 A | 7/1998 | Sameshina et al. | |
| 5,778,308 A | 7/1998 | Sroka et al. | |
| 5,830,591 A | 11/1998 | Sengupta et al. | |
| 5,834,975 A | 11/1998 | Bartlett et al. | |
| 5,864,932 A | 2/1999 | Evans et al. | |
| 5,870,670 A | 2/1999 | Ripley | |
| 5,880,921 A | 3/1999 | Tham et al. | |
| 5,889,852 A | 3/1999 | Rosecrans et al. | |
| 5,892,486 A | 4/1999 | Cook et al. | |
| 5,908,811 A | 6/1999 | Das | |
| 5,910,994 A | 6/1999 | Lane et al. | |
| 5,945,887 A | 8/1999 | Makino et al. | |
| 5,965,494 A | 10/1999 | Terashima et al. | |
| 5,973,567 A | 10/1999 | Heal et al. | |
| 5,973,568 A | 10/1999 | Shapiro et al. | |
| 5,977,917 A | 11/1999 | Hirose | |
| 5,986,515 A | 11/1999 | Sakurai | |
| 5,987,314 A | 11/1999 | Salto | |
| 5,990,766 A | 11/1999 | Zhan | |
| 6,008,659 A | 12/1999 | Traynor | |
| 6,018,282 A | 1/2000 | Tsuda | |
| 6,020,787 A | 2/2000 | Kim et al. | |
| 6,026,311 A | 2/2000 | Willemsen Cortes et al. | |
| 6,028,561 A | 2/2000 | Takei | |
| 6,049,726 A | 4/2000 | Gruenwald et al. | |
| 6,052,036 A | 4/2000 | Enstrom et al. | |
| 6,054,908 A | 4/2000 | Jackson | |
| 6,084,951 A | 7/2000 | Smith et al. | |
| 6,094,588 A | 7/2000 | Adam | |
| 6,097,263 A | 8/2000 | Mueller et al. | |
| 6,101,102 A | 8/2000 | Brand et al. | |
| 6,108,191 A | 8/2000 | Bruchhaus et al. | |
| 6,137,367 A * | 10/2000 | Ezzedine et al. | 330/311 |
| 6,160,524 A | 12/2000 | Wilber | |
| 6,181,777 B1 | 1/2001 | Kiko | |
| 6,198,441 B1 | 3/2001 | Okabe | |
| 6,216,020 B1 | 4/2001 | Findikoglu | |
| 6,242,843 B1 | 6/2001 | Pohjonen et al. | |
| 6,272,336 B1 | 8/2001 | Appel et al. | |
| 6,278,383 B1 | 8/2001 | Endo et al. | |
| 6,281,023 B2 | 8/2001 | Eastep et al. | |
| 6,281,534 B1 | 8/2001 | Arita et al. | |
| 6,285,337 B1 | 9/2001 | West et al. | |
| 6,292,143 B1 | 9/2001 | Romanofsky | |
| 6,294,964 B1 | 9/2001 | Satoh | |
| 6,304,145 B1 * | 10/2001 | Laureanti et al. | 330/285 |
| 6,308,051 B1 | 10/2001 | Atokawa | |
| 6,327,463 B1 | 12/2001 | Welland | |
| 6,329,959 B1 | 12/2001 | Varadan et al. | |
| 6,333,719 B1 | 12/2001 | Varadan | |
| 6,335,710 B1 | 1/2002 | Falk et al. | |
| 6,344,823 B1 | 2/2002 | Deng | |
| 6,359,444 B1 | 3/2002 | Grimes | |
| 6,362,690 B1 | 3/2002 | Tichauer | |
| 6,362,784 B1 | 3/2002 | Kane et al. | |
| 6,362,789 B1 | 3/2002 | Trumbull et al. | |
| 6,384,785 B1 | 5/2002 | Kamogawa et al. | |
| 6,400,963 B1 * | 6/2002 | Glockler et al. | 455/553.1 |
| 6,404,304 B1 | 6/2002 | Kwon et al. | |
| 6,421,016 B1 | 7/2002 | Philips et al. | |
| 6,456,236 B1 | 9/2002 | Hauck et al. | |
| 6,462,628 B2 | 10/2002 | Kondo et al. | |
| 6,489,860 B1 | 12/2002 | Ohashi | |
| 6,503,786 B2 | 1/2003 | Klodzinski | |
| 6,518,850 B1 | 2/2003 | Falk et al. | |
| 6,518,920 B2 | 2/2003 | Proctor, Jr. et al. | |
| 6,522,220 B2 | 2/2003 | Yamada et al. | |
| 6,525,630 B1 | 2/2003 | Zhu et al. | |
| 6,525,691 B2 | 2/2003 | Varadan et al. | |
| 6,531,936 B1 | 3/2003 | Chiu et al. | |
| 6,559,737 B1 | 5/2003 | Nagra et al. | |
| 6,571,110 B1 | 5/2003 | Patton et al. | |
| 6,600,456 B2 | 7/2003 | Gothard et al. | |
| 6,653,977 B1 | 11/2003 | Okabe et al. | |
| 6,667,723 B2 | 12/2003 | Forrester | |
| 6,686,817 B2 | 2/2004 | Zhu et al. | |
| 6,721,293 B1 | 4/2004 | Komulainen et al. | |
| 6,727,535 B1 | 4/2004 | Sengupta et al. | |
| 6,750,719 B2 * | 6/2004 | Toyota et al. | 330/285 |
| 6,819,203 B2 | 11/2004 | Taniguchi | |
| 6,842,086 B1 | 1/2005 | Zennamo et al. | |
| 6,873,294 B1 | 5/2005 | Anderson et al. | |
| 6,898,450 B2 | 5/2005 | Eden et al. | |
| 6,985,113 B2 | 1/2006 | Nishimura et al. | |
| 6,987,486 B2 | 1/2006 | Kurjenheimo et al. | |
| 7,071,776 B2 * | 7/2006 | Forrester et al. | 330/129 |
| 2001/0026243 A1 | 10/2001 | Koitsalu et al. | |
| 2001/0043159 A1 | 11/2001 | Masuda et al. | |
| 2002/0049064 A1 | 4/2002 | Banno | |
| 2002/0071173 A1 * | 6/2002 | Lee et al. | 359/337.1 |
| 2002/0149526 A1 | 10/2002 | Tran et al. | |

| | | | |
|---|---|---|---|
| 2002/0149535 A1 | 10/2002 | Toncich | |
| 2002/0175878 A1 | 11/2002 | Toncich | |
| 2003/0062971 A1 | 4/2003 | Toncich | |
| 2003/0134665 A1 | 7/2003 | Kato et al. | |
| 2003/0157907 A1* | 8/2003 | Leinonen et al. | 455/115 |
| 2003/0169206 A1 | 9/2003 | Egawa | |
| 2004/0087280 A1 | 5/2004 | Watanabe et al. | |
| 2004/0162047 A1 | 8/2004 | Kasahara et al. | |
| 2004/0196121 A1 | 10/2004 | Toncich | |
| 2004/0204145 A1 | 10/2004 | Nagatomo | |
| 2004/0207722 A1 | 10/2004 | Koyama et al. | |
| 2004/0263411 A1 | 12/2004 | Fabrega-Sanchez et al. | |
| 2005/0007291 A1 | 1/2005 | Fabrega-Sanchez et al. | |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 | 2/1995 |
| EP | 0 680 108 | 11/1995 |
| EP | 0 795 922 | 9/1997 |
| EP | 0 854 567 | 7/1998 |
| EP | 0 872 953 | 10/1998 |
| EP | 0 881 700 | 12/1998 |
| EP | 0 892 459 | 1/1999 |
| EP | 0 909 024 | 4/1999 |
| EP | 1 043 741 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001 338839 | 12/2001 |
| WO | WO 82/03510 | 10/1982 |
| WO | WO 94/27376 | 11/1994 |
| WO | WO 00/35042 | 6/2000 |
| WO | WO 00/62367 | 10/2000 |
| WO | WO 03/058759 | 7/2001 |
| WO | WO 02/084798 | 10/2002 |

OTHER PUBLICATIONS

Cuthbert, T., "Broadband Impedance Matching—Fast and Simple", RF Design, Cardiff Publishing Co., vol. 17, No. 12, Nov. 1994, pp. 38, 42, 44, 48, XP000477834.

Dishal, M., "Alignment and Adjustment of Synchronously Tunned Multiple Resonator-Circuit Filters," Proc. IRE 39, Nov. 1951, pp. 1448-1455.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Fubini, E.G. et al., "Minimum Insertion Loss Filters," Proc. IRE 47, Jan. 1959, pp. 37-41.

Fujita, K. et al., "A 15.6 GHz Commercially Based 1/8 GaAs Dynnamic Presealer," 1989 IEEE GaAs IC Symposium, pp. 113-116.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Getsinger, W.J., "Prototypes for Use in Broadbanding Reflection Amplifiers," IEEE Trans. PTGMTT-11, Nov. 1963, pp. 486-497.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Gevorgian, Spartak S. et al., "HTS/Ferroelectric Devices for Microwave Applications", IEEE Transactions on Applied Superconductivity, Jun. 1997, pp. 2458-2461, IEEE, USA.

Hopf, B. et al., "Coplanar MMIC Active Bandpass Filters Using Negative Resistance Circuits," 1994 IEEE MTT-S Symposium Digest, pp. 1183-1185.

Hunter, I.C. et al., "Electronically Tunable Microwave Bandpass Filters," IEEE Trans. on MTT, vol. 30, No. 9, Sep. 1982, pp. 1354-1367.

Jose et al., "Experimental investigations on electronically tunable microstrip antennas," Feb. 5, 1999, Microwave and optical technology letters, vol. 20, No. 3, pp. 166-169.

Kapilevich, B., "Understand the Operation of Channelized Active Filters," Microwaves & RF, Jan. 1997, pp. 89-92.

Kapilevich, B., "Variety of Approaches to Designing Microwave Active Filters," Proc. 27th European Microwave Conference, Jerusalem, vol. 1, 1997, pp. 397-408.

Karacaoglu, U. et al., "High Selectivity Varactor-Tuned MMIC Bandpass Filter Using Lossless Active Resonators," 1994 IEEE MTT-Symposium Digest, pp. 1191-1194.

Katzin, P. et al., "Narrow-band MMIC Filters with Automatic Tuning and Q-Factor Control," 1993 IEEE MTT-S Int. Microwave Symposium Digest, pp. 403-406.

Keis, V. N. et al., "20GHz tunable filter based on ferroelectric (BaSr)TiO3 film varactors", Electronics Letters, May 28, 1998, vol. 34, No. 11, IEE Stevenage, GB.

Kotzebue, K.L., "Broadband Electronically-Tunable Microwave Filters," 1960 IRE Wescon Convention Record, Part 1, pp. 21-27.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Kuh, E.S. et al., "Optimum Synthesis of Wide-Band Parametric Amplifiers and Converters," IRE Trans. PCCT-8, Dec. 1961, pp. 410-415.

Louhos, J.P. et al., "Electrical Tuning of Integrated Mobile Phone Antennas," Nokia Mobile Phones, pp. 69-97 (Sep. 15, 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Matthaei, G.L., "An Electronically Tunable Up-Converter," Proc. IRE 49, Nov. 1961, pp. 1703-1704.

Nauta, B., "A CMOS Transconductance-C Filter Technique for Very High Frequencies," IEEE Journal of Solid-State Circuits, vol. 27, No. 2, Feb. 1992, pp. 142-153.

Panayi, P.K. et al., "Tuning Techniques for the Planar Inverted-F Antenna," National Conference on Antennas and Propagation Publication, No. 461, pp. 259-262, (Apr. 1999).

Presser, A., "Varactor-Tunable, High-Q Microwave Filter," RCA Review, vol. 42, Dec. 1981, pp. 691-705.

Sleven, R.L., "Design of a Tunable Multi-Cavity Waveguide Band-Pass Filter," 1959 IRE National Convention Record, Part 3, pp. 91-112.

Smuk, J. et al., "MMIC Phase Locked L-S Band Oscillators," 1994 IEEE GaAs Symposium Digest, pp. 27-29.

Taub, J.J. et al., "Design of Three-Resonator Dissipative Band-Pass Filters Having Minimum Insertion Loss," Proc. IRE 45, pp. 681-687 (May 1957).

Toncich et al., "Data Reduction Method for Q Measurements of Stripline Resonators", IEEE Transactions in MTT, vol. 40, No. 9, Sep. 1992, pp. 1833-1836.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Varadan, V.K. et al., "Design and Development of Electronically Tunable Microstrip Antennas," IOP Publishing Ltd., pp. 238-242, (1999).

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

* cited by examiner

VARIABLE-LOSS TRANSMITTER AND METHOD OF OPERATION

FIELD OF THE INVENTION

The present invention relates to the field of wireless communication devices. More specifically, the invention relates to RF transmitters for wireless communication devices.

BACKGROUND OF THE INVENTION

A typical wireless communication device, such as a mobile phone, comprises, among other things, a processor coupled to a memory and to a transceiver, each enclosed in a housing. A mobile power source, such as a battery, is coupled to and supplies power to the processor, the memory and the transceiver. A speaker and a microphone are also enclosed within the housing for transmitting and receiving, respectively, acoustic signals to and from a user of the wireless communication device. The wireless communication device communicates information by transmitting and receiving electromagnetic ("EM") energy in the radio frequency ("RF") band via an antenna coupled to the transceiver.

During transmission, the source signal is modulated, amplified and transmitted via the antenna. Conventional wireless communication devices include a power amplifier that has a fixed gain for amplifying the modulated signal prior to transmission. The simplicity of such an implementation, however, is achieved at the cost of reduced signal-to-noise ratio ("SNR"), particularly during low power operation. For example, in order to operate the wireless device at low power while maintaining a relatively fixed power amplification, the source signal may need to be significantly attenuated, resulting in reduced signal levels and, ultimately, in reduced SNR. Reduced SNR significantly diminishes the performance of the wireless communication device. This problem is even more pronounced for mobile handsets, such as CDMA mobile handsets, which operate in low power for a substantial amount of the time.

SUMMARY OF THE INVENTION

A variable-loss transmitter and method for operation are disclosed which address and resolve one or more of the disadvantages associated with conventional RF transmitters, as discussed above.

By way of illustration, an exemplary transceiver comprises a power amplifier configured to receive a source signal and generate an amplified output signal, an antenna coupled to the power amplifier, the antenna being configured to radiate the amplified output signal, and a controller coupled to the power amplifier. The controller is configured to control an effective gain of the power amplifier responsive to a power level of operation of the transmitter. A source amplifier configured to operate on the source signal prior to power amplification is also controlled by the controller. More particularly, the controller configures the gain level of the source amplifier based on the power level of operation of the transmitter and the effective gain of the power amplifier to improve SNR.

In operation, the power amplifier has a first effective gain during a low power operation of the transmitter and a second effective gain during a high power operation of the transmitter, where the first effective gain is less than the second effective gain. For example, the power amplifier may have a variable gain controlled by the controller. Alternatively, the transmitter may further include a variable-loss filter coupled between the power amplifier and the antenna. According to this particular embodiment, the controller is further coupled to the variable-loss filter to configure the variable-loss filter to have a first signal attenuation level during the low power operation of the transmitter and a second signal attenuation level during the high power operation of the transmitter, wherein the first signal attenuation level is greater than the second signal attenuation level. By way of example, the variable-loss filter could also be implemented by way of a variable or tunable matching circuit, where the match could be adjusted for a particular gain.

As a benefit of this approach, the controller is able to configure the source amplifier to have a decreased signal attenuation (increased gain level) during the low power operation of the transmitter in contrast to conventional techniques which increase the source signal attenuation during low power operation. As discussed below, reduction in the source signal attenuation results in improved SNR, and ultimately, improved device performance.

Other features and advantages of the present invention will become more readily apparent to those of ordinary skill in the art after reviewing the following detailed description and accompanying drawings.

DETAILED DESCRIPTION OF THE INVENTION

Figure 1:
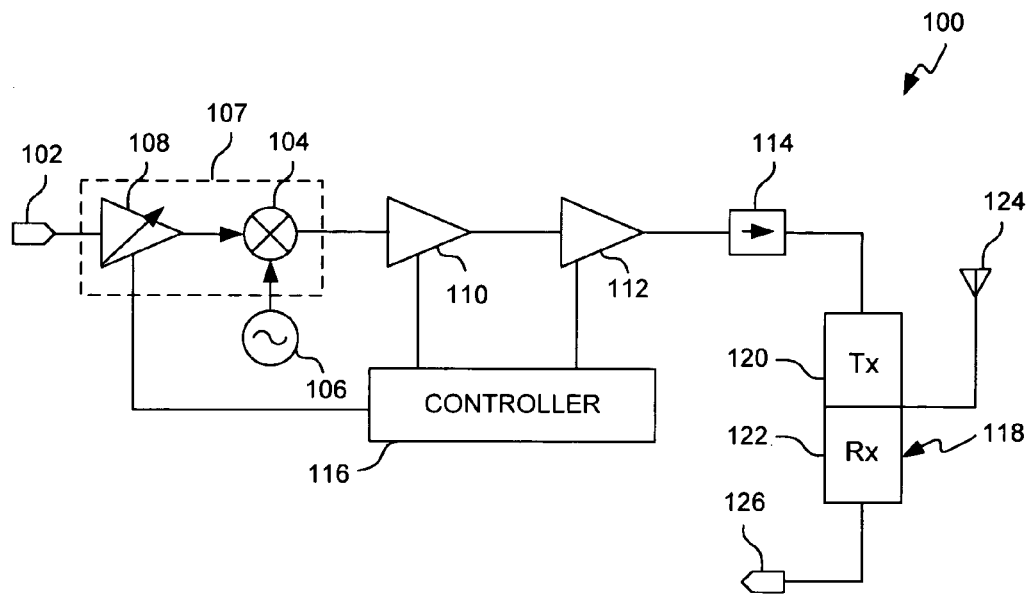
FIG. 1 illustrates a functional block diagram of an exemplary transceiver according to one embodiment of the present invention.

Referring first to FIG. 1, there is shown a simplified view of exemplary transceiver 100 according to one embodiment of the present invention. Transceiver 100 may, for example, be implemented in a wireless communication device, such as a mobile phone or a base station, capable of communicating RF signals in one or more frequency bands. As discussed in greater detail below, transceiver 100 achieves significantly improved SNR during low power operation.

As shown in FIG. 1, transceiver 100 comprises source amplifier 108, mixer 104, driver amplifier 110, power amplifier 112, isolator 114, duplexer 118 and antenna 124. Controller 116 controls the operation of transceiver 100 and, more particularly, the operation of source amplifier 108, driver amplifier 110 and/or power amplifier 112, as discussed below.

Although duplexer 118 includes transmits path 120 and receive path 122, the present discussion will be limited to communications associated with transmit path 120. As such, transceiver 100 will also simply be referred to as "transmitter" 100 herein. Processing of signals 126 from receive path 122 can be carried out according to various techniques and will not be discussed in great detail herein. Although not shown for ease of illustration, it is noted that multiple transceivers may be provided in a single wireless communication device, each transceiver capable of benefiting from the advantages provided by the present invention.

Continuing with FIG. 1, source signal 102 may be preprocessed by a number of components prior to processing by mixer 104. For example, source signal 102 is typically amplified by source amplifier 108 prior to modulation by mixer 104. For example, source amplifier 108 may be an automatic gain controller (AGC). In certain embodiments, source signal 102 may be modulated from a baseband signal to an intermediate frequency ("IF") signal and subsequently amplified by source amplifier 108 prior to further processing by mixer 104. In other embodiments, source signal 102 may be a baseband signal and may be converted to RF by a baseband to RF converter, represented by block 107 in FIG. 1. In such an embodiment, the function of source amplifier 108 may be implemented by way of one or more amplifiers.

Mixer 104 upconverts source signal 102 with a carrier signal generated by oscillator 106. Driver amplifier 110 and power amplifier 112 amplify the upconverted signal generated by mixer 104 and supplies the amplified signal to isolator 114 for transmission via duplexer 118 and antenna 124. Isolator 114 generally provides signal flow control, typically preventing signals from flowing from its output port to its input port, thereby protecting components on its input port, e.g., amplifiers 110 and 112, from damaging signal sources, such as excessive signal reflection, for example.

Unlike conventional RF transmitter arrangements employing fixed-gain power amplifiers, power amplifier 112 has a variable gain controlled by controller 116. The term "fixed gain" as used herein also encompasses gain that is relatively fixed, which may include some variations, such as incidental gain variations caused by another feature. An example of incidental gain variation would be a drop in gain caused by moving the quiescent point so the amplifier dissipates less power and is more efficient. Similarly, driver amplifier 110 may also be configured to have a variable gain controlled by controller 116. More particularly, power amplifier 112 and/or driver amplifier 110 has a variable gain during at least low power operation of transmitter 100, and in certain embodiments, throughout a substantial portion of the power range of operation of transmitter 100. The gain levels of power amplifier 112 and driver amplifier 110 are controlled by controller 116 in accordance with the particular power level of operation of transmitter 100, where the power level of operation of transmitter 100 may be defined by the device incorporating transmitter 100, a device in communication with transmitter 100, both devices, or some other technique for defining the power level of operation of transmitter 100. In typical CDMA systems, for example, the base station communicates a power control signal to the mobile handset, indicating whether the mobile handset is to increase or decrease its transmission power. Furthermore, in certain operation states, the mobile handset may employ open loop power control, e.g., where the mobile handset defines its transmit power based on a detected power strength of a signal received from a base station.

During low power operation, controller 116 sets the gain of power amplifier 112 and/or the gain of driver amplifier 110 to low levels. The reduced gain levels of power amplifier 112 and/or driver amplifier 110 during low power operation permits controller 116 to set the amount of signal attention by source amplifier 108 operating on source signal 102 to a low level, thereby maintaining the proper signal level. Beneficially, the noise floor is lowered, and transmission may be carried out at an even lower level. The reduced gain levels of power amplifier 112 and/or driver amplifier 110 may be achieved by varying the effective gain of power amplifier 112 and/or driver amplifier 110. According to one illustrative embodiment, the gain may be adjusted by switching off or otherwise bypassing one or more amplifier stages of power amplifier 112 and/or driver amplifier 110. Such functionality could be implemented by way of a tunable matching network, for example.

As a result of the reduced signal attenuation of source amplifier 108 operating on a source or intermediate signal, transmitter 100 achieves significantly improved SNR, ultimately resulting in improved device performance. Effectively, controller 116 operates power amplifier 112 and/or driver amplifier 110 in a variable-loss mode during low power operation. This approach is in significant contrast to conventional techniques wherein source amplifier 108 would be used to vary power level of its associated transmitter and wherein driver amplifier 110 and power amplifier 112 have fixed gain, such that for low power operation, source amplifier 108 has high signal attenuation, and during high power operation, source amplifier 108 has high gain (low signal attenuation). Thus, in the conventional approach, during low power operation the high signal attenuation by source amplifier 108 results in low signal levels and reduced SNR.

As transmitter 100 transitions from low power to high power operation, the gain of power amplifier 112 and/or the gain of driver amplifier 110 is increased. However, increases in the gain of power amplifier 112 and/or the gain of driver amplifier 110 are controlled by controller 116 such that the level of signal attenuation by source amplifier 108 is minimized, thereby providing sufficiently high signal levels and improved SNR while maintaining the transmission power output of transmitter 100 at the correct or specified level. The benefit of improved SNR can thus be realized by transmitter 100 throughout various power levels of operation, including low power operation, mid-power operation, and other intermediate states between a lower power mode and a higher power mode of operation. Typically at high power operation, the signal attenuation by source amplifier 108 is sufficiently low to provide acceptable SNR.

Figure 2:
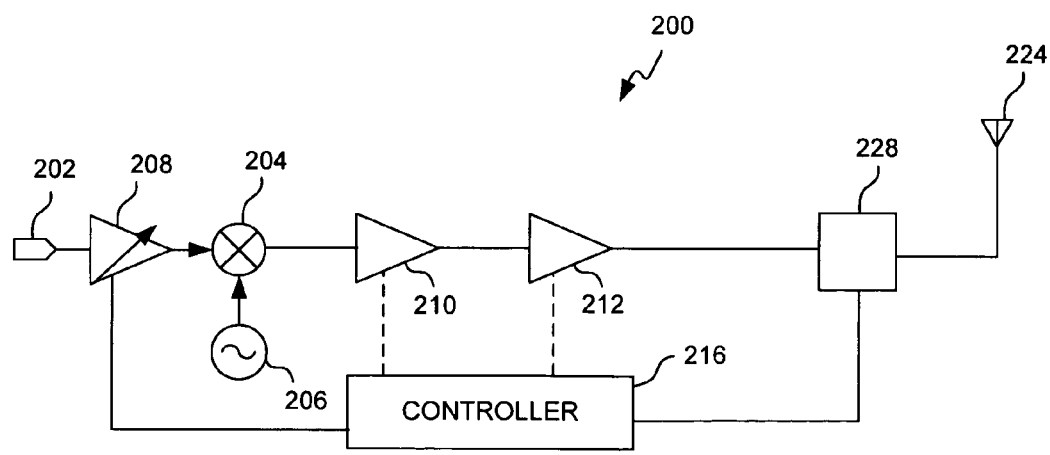
FIG. 2 illustrates a functional block diagram of an exemplary transmitter according to one embodiment of the present invention.

Referring now to FIG. 2, there is shown a simplified view of exemplary transmitter 200 according to another embodiment of the present invention. In FIG. 2, source signal 202, source amplifier 208, mixer 204, oscillator 206, and antenna 224 correspond to source signal 102, source amplifier 108, mixer 104, oscillator 106, and antenna 124, respectively, in FIG. 1. The benefits of the particular embodiment depicted in FIG. 2 and described below may be achieved with variable-gain or fixed-gain driver amplifier 210 and/or variable-gain or fixed-gain power amplifier 212.

As shown in FIG. 2, transmitter 200 further includes variable-loss filter 228 coupled between power amplifier 212 and antenna 224. Variable-loss filter 228 may, for example, be included in a duplexer or diplexer (not shown) or implemented in a matching circuit coupled to the output of power amplifier 212. By way of illustration, variable-loss filter 228, may be a variable-loss Ferro-Electric ("FE") filter configured to attenuate the RF gain supplied to antenna 224 responsive to a control voltage supplied by controller 216. With this arrangement, controller 216 is able to control the effective loss/gain of power amplifier 212 and/or driver amplifier 210, even in the case where power amplifier 212 and/or driver amplifier 210 are fixed-gain devices.

During low power operation, controller 216 increases the loss of variable-loss filter 228, thereby reducing the effective gain of power amplifier 212 and/or the effective gain of driver amplifier 210 as presented to antenna 224. As discussed above, this effective reduction in the gain of power amplifier 212 and/or driver amplifier 210 during low power operation permits controller 216 to decrease the signal attenuation by source amplifier 208 operating on source signal 202 while maintaining low power operation. Also discussed above, the decrease in the signal attenuation by source amplifier 208 results in significantly improved SNR, ultimately resulting in improved device performance.

Figure 3:
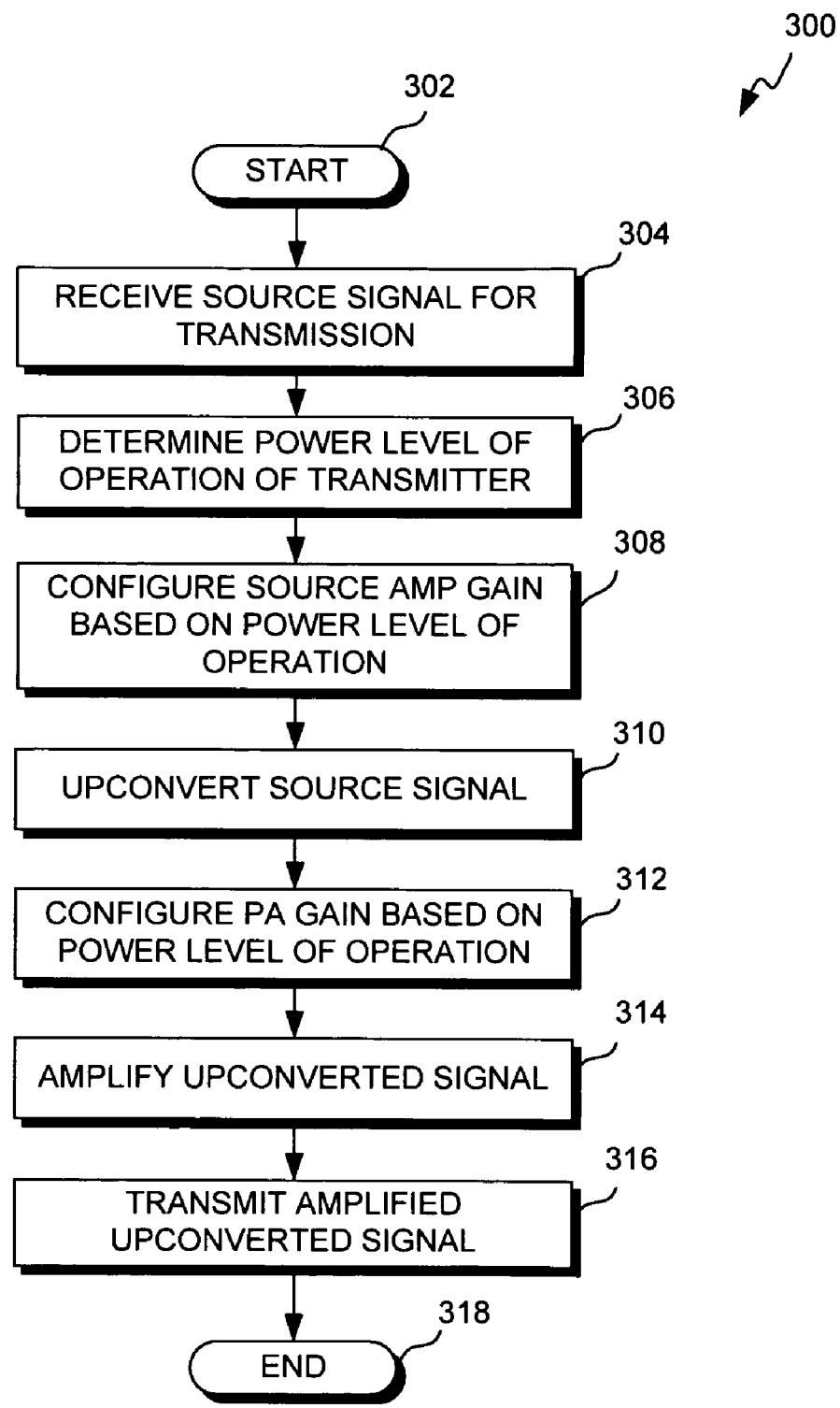
FIG. 3 illustrates a flow chart depicting an exemplary variable-loss transmitter operation according to one embodiment of the present invention.

To illustrate these and other potential features, reference is now made to FIG. 3, which depicts flow chart 300 of an exemplary variable-loss operation of a transmitter, such as transmitter 100 or 200, according to one embodiment of the present invention. Certain details and features have been left out of flow chart 300 of FIG. 3 that are apparent to a person of ordinary skill in the art. For example, a step may consist of one or more sub-steps, as known in the art. While steps 302 through 318 shown in flow chart 300 are sufficient to describe one embodiment of the present invention, other embodiments of the invention may utilize steps different from those shown in flow chart 300. The present invention further relates to machine readable media on which are stored embodiments of the present invention. It is contemplated that any media suitable for storing instructions is within the scope of the present invention. By way of example, such media may take the form of magnetic, optical, or semiconductor media. The invention also relates to data structures that contain embodiments of the present invention, and to the transmission of data structures containing embodiments of the present invention.

Referring now to flow chart 300, variable-loss transmitter operation begins at block 302, and at block 304, a source signal is received by the transmitter for processing. At block 306, the controller determines the power level of operation for transmission of the source signal. As discussed above, a number of techniques may be used to determine the power level of operation.

If the transmitter is required to operate in low power operation, the controller at block 308, communicates a control signal to set the gain of the source amplifier to a high gain (i.e., low signal attenuation). For example, controller 116 may provide a control signal to set the gain of source amplifier 108 to low signal attenuation during low power operation. As discussed above, in certain embodiments, the source signal may be modulated from a baseband signal to an intermediate frequency ("IF") signal prior to amplification by source amplifier 108. Also discussed above, the signal attenuation by source amplifier 108 operating on source signal 102 can be set to a low level during low power operation because the effective gain(s) of power amplifier 112 and/or driver amplifier 110 are set to low levels to maintain low power operation. As a result of the decrease the in signal attenuation by source amplifier 108 operating on a source or intermediate signal, transmitter 100 achieves significantly improved SNR, ultimately resulting in improved device performance.

At block 310, the mixer upconverts the source signal with a carrier signal generated by a local oscillator. If the transmitter is required to operate in low power operation, the controller at block 312 decreases the effective gain of the power amplifier ("PA"). Also discussed above, the controller may also decrease the effective gain of the driver amplifier. In the particular embodiment described above in conjunction with FIG. 1, controller 116 communicates a control signal to set the gain of power amplifier 112 to a low gain during low power operation, thereby reducing the effective gain of power amplifier 112. Also discussed above, controller 116 may also transmit a control signal to set the gain of driver amplifier 110 to a low gain. In the particular embodiment described above in conjunction with FIG. 2, block 312 is carried out by controller 216 communicating a control signal to increase the loss of variable-loss filter 228 during low power operation, thereby reducing the effective gain of power amplifier 212.

At block 314, the upconverted signal is amplified by the driver amplifier and the power amplifier in accordance with the gains set during block 312. Finally, the amplified upconverted signal is transmitted via the antenna at block 316, and variable-loss transmitter operation concludes at block 318.

From the above description of exemplary embodiments of the invention, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the techniques described with regard to FIGS. 1 and 2 could be combined with each other and/or other techniques for increasing the effective loss of the power amplifier during low power operations without departing from the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

What is claimed is:

1. A transmitter for communicating information, the transmitter comprising:
   a power amplifier configured to receive a source signal and generate an amplified output signal;
   an antenna coupled to the power amplifier, the antenna configured to radiate the amplified output signal;
   a variable-loss filter coupled between the power amplifier and the antenna; and
   a controller coupled to the power amplifier and the variable loss filter, the controller configured to control a gain of the power amplifier responsive to a power level of operation of the transmitter to a establish first gain of the power amplifier during a low power operation of the transmitter and a second gain during a high power operation of the transmitter, the first gain being less than the second gain, the controller further configured to control an attenuation of the variable-loss filter to establish a first signal attenuation level during the low power operation of the transmitter and a second signal attenuation level during the high power operation of the transmitter, the first signal attenuation level being greater than the second signal attenuation level.

2. The transmitter of claim 1 wherein the power amplifier has a variable gain controlled by the controller.

3. The transmitter of claim 2 wherein the variable-loss filter comprises a ferro-electric filter configured to attenuate the amplified output signal in response to a control command from the controller.

4. The transmitter of claim 3 further comprising a duplexer coupled between the power amplifier and the antenna, the variable-loss filter integrated in the duplexer.

5. The transmitter of claim 2 wherein the variable-loss filter comprises a matching circuit coupled to an output of the power amplifier.

6. The transmitter of claim 2 wherein the controller is further coupled to a source amplifier, the source amplifier configured to operate on the source signal, the controller configured to set a gain level of the source amplifier based on the power level of operation of the transmitter and the effective gain of the power amplifier.

7. The transmitter of claim 6 further comprising a mixer coupled between an output of the source amplifier and an input of the power amplifier, the mixer configured to:
receive signals from the output of the source amplifier, upconvert the received signals over a radio frequency signal to generate upconverted signals, and transmit the upconverted signals to the input of the power amplifier.

8. A method for transmitting a source signal for wireless communication by a transmitter, the transmitter including a power amplifier coupled to an antenna, the method comprising:
receiving the source signal; determining a power level of operation of the transmitter;
configuring the power amplifier to have a first gain during a low power operation of the transmitter;
configuring the power amplifier to have a second gain during a high power operation of the transmitter, the first gain being less than the second gain;
amplifying, by the power amplifier, the source signal into an amplified output signal;
configuring a variable-loss filter connected between the power amplifier and the antenna to have a first signal attenuation level during the low power operation of the transmitter; and
configuring the variable-loss filter to have a second signal attenuation level during the high power operation of the transmitter, the first signal attenuation level being greater than the second signal attenuation level; and
transmitting the amplified output signal via the antenna.

9. The method of claim 8 wherein the controller is further configured to set a variable gain of the power amplifier to a high gain during the high power operation of the transmitter and to a low gain during the low power operation of the transmitter.

10. The method of claim 9 wherein configuring the variable-loss filter comprises configuring a matching circuit coupled to an output of the power amplifier.

11. The method of claim 9 further comprising configuring a gain level of a source amplifier based on the power level of operation of the transmitter and the gain of the power amplifier.

12. The method of claim 11 further comprising:
receiving signals from an output of the source amplifier;
modulating the received signals over a radio frequency signal to generate upconverted signals; and
transmitting the upconverted signals to the input of the power amplifier.

13. The method of claim 9 wherein configuring the variable-loss filter comprises configuring a ferro-electric filter configured to attenuate the amplified output signal in response to a control command.

14. The method of claim 13 wherein the transmitting comprises transmitting the amplified output signal through a duplexer coupled between the power amplifier and the antenna, the variable-loss filter integrated in the duplexer.

15. A wireless communication device comprising:
a housing;
a transceiver situated in the housing, the transceiver coupled to an antenna for transmitting and receiving radio frequency signals in a plurality of frequency bands; a mobile power source supplying power to the transceiver, the transceiver comprising:
a power amplifier configured to receive a source signal and generate an amplified output signal, the power amplifier being coupled to the antenna, the antenna configured to radiate the amplified output signal;
a variable-loss filter coupled between the power amplifier and the antenna; and
a controller coupled to the power amplifier and the variable-loss filter, the controller configured to control a gain of the power amplifier responsive to a power level of operation of the transceiver to establish a first gain during a low power operation of the transceiver and a second gain during a high power operation of the transceiver, the first gain being less than the second gain, controller configured to control an attenuation of the variable-loss filter to establish a first signal attenuation level during the low power operation of the transceiver and a second signal attenuation level during the high power operation of the transceiver, the first signal attenuation level being greater than the second signal attenuation level.

16. The wireless communication device of claim 15 wherein the power amplifier has a variable gain controlled by the controller.

17. The wireless communication device of claim 16 wherein the variable-loss filter comprises a ferro-electric filter configured to attenuate the amplified output signal in response to a control command from the controller.

18. The wireless communication device of claim 17 further comprising a duplexer coupled between the power amplifier and the antenna, the variable-loss filter integrated in the duplexer.

19. The wireless communication device of claim 16 wherein the variable-loss filter comprises a matching circuit coupled to an output of the power amplifier.

20. The wireless communication device of claim 16 further comprising a source amplifier configured to operate on the source signal, the controller configured to set a gain level of the source amplifier based on the power level of operation of the transmitter and the effective gain of the power amplifier.

* * * * *